United States Patent
Mizukoshi et al.

(10) Patent No.: US 8,735,274 B2
(45) Date of Patent: May 27, 2014

(54) MANUFACTURE METHOD FOR SEMICONDUCTOR DEVICE WITH BRISTLED CONDUCTIVE NANOTUBES

(75) Inventors: Masataka Mizukoshi, Kawasaki (JP); Taisuke Iwai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 545 days.

(21) Appl. No.: 12/823,750

(22) Filed: Jun. 25, 2010

(65) Prior Publication Data

US 2010/0261343 A1 Oct. 14, 2010

Related U.S. Application Data

(63) Continuation of application No. PCT/JP2008/003544, filed on Dec. 1, 2008.

(30) Foreign Application Priority Data

Feb. 15, 2008 (JP) .................................. 2008-035167

(51) Int. Cl.
*H01L 21/44* (2006.01)
(52) U.S. Cl.
USPC .................... 438/610; 257/E21.509; 977/742
(58) Field of Classification Search
CPC ..................... H01J 2201/30469; H01J 1/3044; H01L 2924/01079; H01L 2924/00014; H01L 2924/01006; H01L 2924/014
USPC .......................... 438/610, 612, 676; 977/742; 257/E21.509, E21.294
See application file for complete search history.

(56) References Cited

U.S. PATENT DOCUMENTS

| | | | | |
|---|---|---|---|---|
| 6,124,208 A | * | 9/2000 | Park et al. | 438/696 |
| 6,241,857 B1 | * | 6/2001 | Yamada | 204/192.12 |
| 6,340,822 B1 | * | 1/2002 | Brown et al. | 257/25 |
| 7,150,801 B2 | | 12/2006 | Fujii et al. | |
| 7,301,779 B2 | | 11/2007 | Honlein et al. | |
| 2004/0233649 A1 | | 11/2004 | Honlein et al. | |
| 2005/0167812 A1 | | 8/2005 | Yoshida et al. | |
| 2006/0057388 A1 | * | 3/2006 | Jin et al. | 428/408 |
| 2006/0081989 A1 | * | 4/2006 | Uang et al. | 257/753 |
| 2007/0103048 A1 | * | 5/2007 | Liu et al. | 313/311 |

(Continued)

FOREIGN PATENT DOCUMENTS

| | | |
|---|---|---|
| EP | 1775768 A1 | 4/2007 |
| EP | 1797748 A1 | 6/2007 |

(Continued)

OTHER PUBLICATIONS

International Search Report of PCT/JP2008/003544, Mailing Date of Feb. 3, 2009.

*Primary Examiner* — Kimberly Rizkallah
*Assistant Examiner* — Duy T Nguyen
(74) *Attorney, Agent, or Firm* — Westerman, Hattori, Daniels & Adrian, LLP

(57) ABSTRACT

Electrodes formed in a partial surface area of a semiconductor substrate and distal ends of conductive nanotubes bristled on a surface of a growth substrate, are bombarded with rare gas plasma. The distal ends of the conductive nanotubes bombarded with the rare gas plasma are brought into contact with the electrodes bombarded with the rare gas plasma to fix the conductive nanotubes to the electrodes. The growth substrate is separated from the semiconductor substrate in such a manner that the conductive nanotubes fixed to the electrodes remain on the electrodes formed on the semiconductor substrate.

6 Claims, 14 Drawing Sheets

(56) References Cited

U.S. PATENT DOCUMENTS

| | | |
|---|---|---|
| 2007/0267735 A1 | 11/2007 | Awano et al. |
| 2008/0092953 A1* | 4/2008 | Lee .............................. 136/261 |
| 2008/0190655 A1 | 8/2008 | Davoine et al. |
| 2009/0115042 A1 | 5/2009 | Koyanagi |

FOREIGN PATENT DOCUMENTS

| | | |
|---|---|---|
| FR | 2876243 A1 | 4/2006 |
| JP | 11-261001 A | 9/1999 |
| JP | 2004-528727 A | 9/2004 |
| JP | 2004-281388 A | 10/2004 |
| JP | 2006-066169 A | 3/2006 |
| JP | 2007-188662 A | 7/2007 |
| JP | 2007-311700 A | 11/2007 |
| JP | 2008-516424 A | 5/2008 |
| WO | 2004/064159 A1 | 7/2004 |
| WO | 2005/119776 A1 | 12/2005 |
| WO | 2006/054005 A1 | 5/2006 |

* cited by examiner

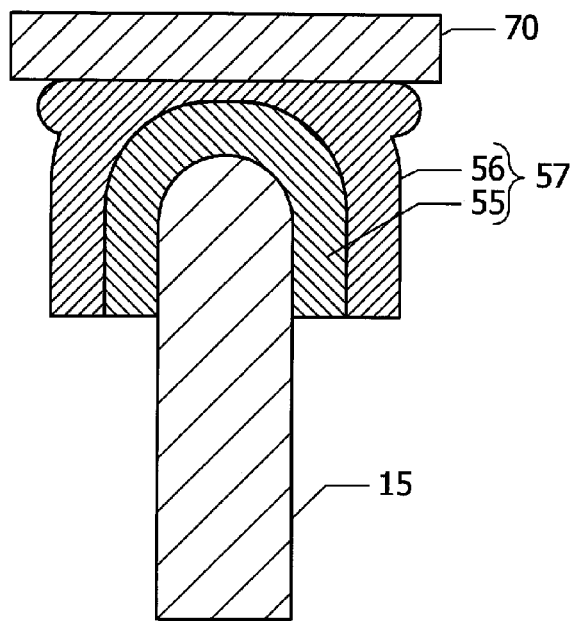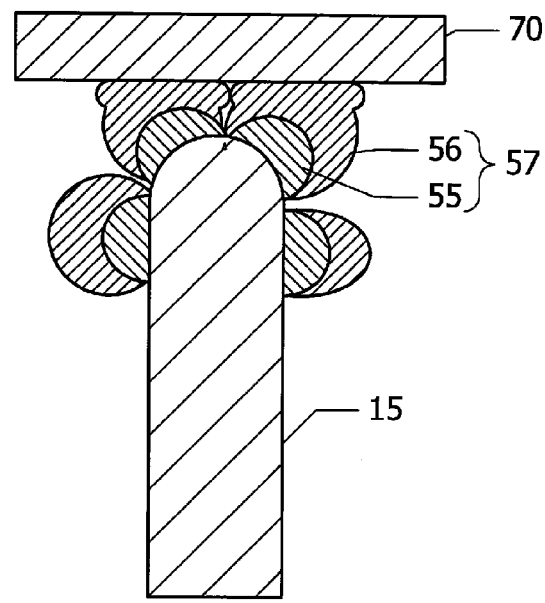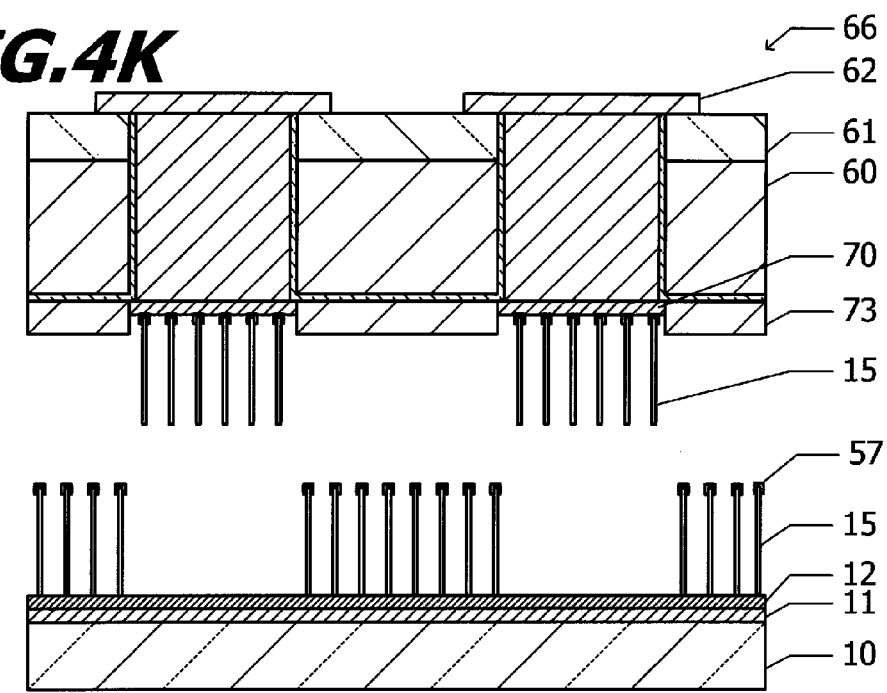

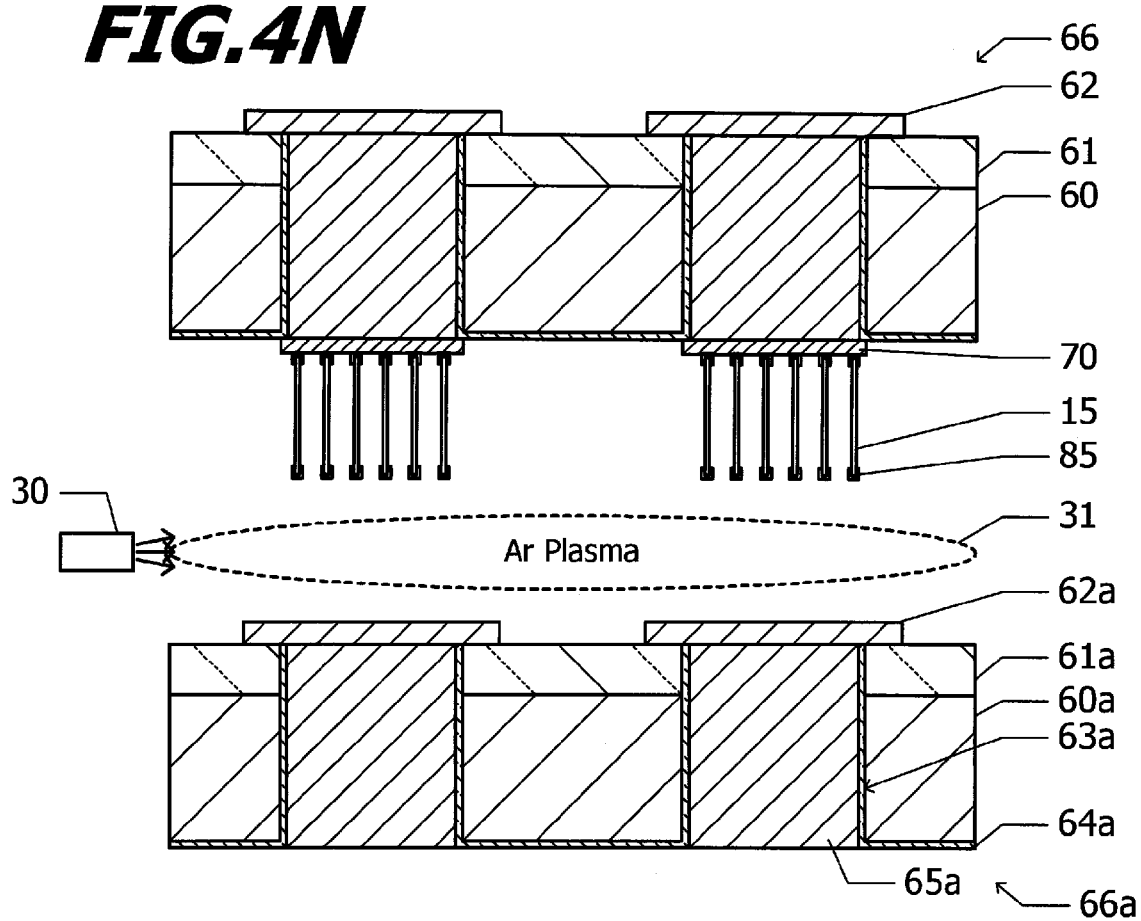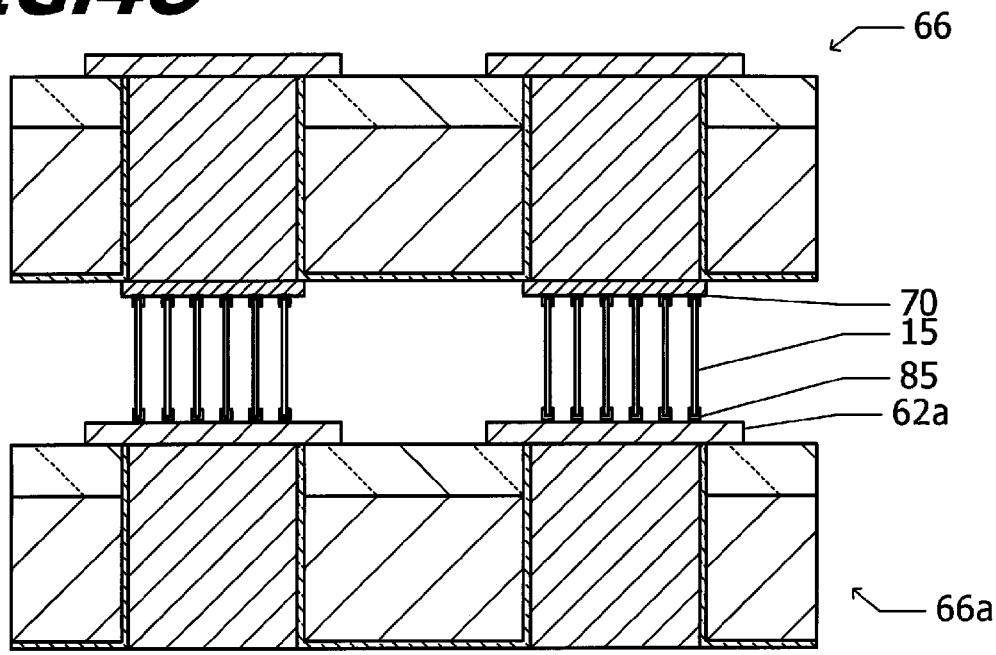

MANUFACTURE METHOD FOR SEMICONDUCTOR DEVICE WITH BRISTLED CONDUCTIVE NANOTUBES

CROSS-REFERENCE TO RELATED APPLICATIONS

This application is based upon and claims the benefit of priority of the prior Japanese Patent Application No. 2008-35167, filed on Feb. 15, 2008, and the prior PCT Application No. JP2008/003544, filed on Dec. 1, 2008, the entire contents of which are incorporated herein by reference.

FIELD

The embodiments discussed herein are related to a manufacture method for a semiconductor device having electrodes formed on a semiconductor device and having conductive nanotubes bristled on the electrodes.

BACKGROUND

Conventionally, when a semiconductor chip is mounted on a mounting board, conductive pads on the mounting board and conductive pads on the semiconductor chip are mechanically and electrically connected by metal bumps made of solder or the like.

As an integration degree of a semiconductor chip is made high and conductive pads are made finer, a current density flowing in the metal bump increases. Metal atoms constituting the metal bump become easy to move by electromigration. Motion of metal atoms may cause breaking of the bump. For example, if a solder bump is used, Sn as bump material is likely to move. As Sn moves and a region having a lower Sn density is formed, breaking is likely to occur in the lowered density region.

During solder is melted for bonding, the semiconductor chip and mounting board are heated to a high temperature. As the semiconductor chip and mounting board are cooled to a room temperature after mounting, a stress is generated due to a thermal expansion coefficient difference between the semiconductor chip and the mounting board. A thermal expansion coefficient of the mounting board is generally equal to or more than ten times a thermal expansion coefficient of the semiconductor chip. As the semiconductor chip and the mounting board are cooled to a room temperature, the mounting board contracts more than the semiconductor chip. A compressive stress is therefore applied to the semiconductor chip along an in-plane direction. As the stress is generated, the mechanically weakest region is broken. For example, metal bumps, low dielectric constant insulating material in semiconductor chips, and the like are broken. A similar stress is generated also by a temperature change during actual operation after mounting.

There are known techniques of connecting conductive pads of a mounting board and conductive pads of a semiconductor chip, by using carbon nanotubes (e.g., Patent Document 1). This connection method will now be described.

Carbon nanotubes are grown from conductive pads of a semiconductor chip by plasma enhanced chemical vapor deposition (PECVD). Proximal ends of the carbon nanotubes are buried in the conductive pads of the semiconductor chip, and distal ends of the carbon nanotubes are buried in conductive pads of a mounting board. Namely, both ends of the carbon nanotubes are connected by soldering to the conductive pads of the semiconductor chip and the mounting board. The semiconductor chip is therefore mechanically and electrically connected to the mounting board via the carbon nanotubes.

It is known that a density of current allowed to flow in one carbon nanotube is higher by two to three digits than that in metal. The carbon nanotube is resistant to breaking by electromigration.

Since carbon nanotubes have flexibility, the mounted semiconductor chip is able to move a little in the in-plane direction with respect to the mounting board. It is therefore possible to prevent the semiconductor chip from being broken by a mechanical stress caused by a thermal expansion coefficient difference.

When carbon nanotubes are formed on conductive pads of a semiconductor substrate, carbon nanotubes are generally grown by spraying catalytic metal such as Ni and Co on the conductive pads and using acetylene as source gas. In this case, a substrate temperature is required to be heated to about 600° C. However, as the semiconductor substrate is heated to a high temperature of about 600° C., the characteristics of a semiconductor element formed on the semiconductor substrate are deteriorated.

If carbon nanotubes are grown at a temperature not deteriorating a semiconductor element, e.g., at a low temperature of about 350° C., the quality of grown carbon nanotubes is low, and moreover a long growth time of several weeks is required.

Also disclosed are techniques of transferring carbon nanotubes grown on an alumina substrate or the like to conductive pads of a semiconductor substrate (e.g., Patent Documents 2 and 3). This method does not require growing carbon nanotubes directly on a semiconductor substrate. It is therefore possible to fix carbon nanotubes of high quality to conductive pads without heating the semiconductor substrate.
(Patent Document)
Japanese Laid-open Patent Publication No. 2004-528727
Japanese Laid-open Patent Publication No. 2007-188662
Japanese Laid-open Patent Publication No. 2004-281388

SUMMARY

With the above-described method, conductive binder such as conductive paste or low melting point metal is disposed in a partial area of a substrate for carbon nanotubes to be bristled. Carbon nanotubes grown on the surface of an alumina substrate or the like are fixed to the conductive binder. When distal ends of the carbon nanotubes are pressed upon the conductive binder, the conductive paste or melted low melting point metal may spread laterally on the substrate surface. It is therefore difficult to transfer carbon nanotubes only in a desired area.

It is desired to realize a method capable of transferring conductive nanotubes such as carbon nanotubes only in an intended area of a substrate.

According to one aspect of the present invention, there is provided a method of manufacturing a semiconductor device including:
bombarding electrodes formed in a partial surface area of a semiconductor substrate and distal ends of conductive nanotubes bristled on a surface of a growth substrate with rare gas plasma;
bringing the distal ends of the conductive nanotubes bombarded with the rare gas plasma into contact with the electrodes bombarded with the rare gas plasma to fix the conductive nanotubes to the electrodes; and
separating the growth substrate from the semiconductor substrate in such a manner that the conductive nanotubes fixed to the electrodes remain on the electrodes formed on the semiconductor substrate.

According to another aspect of the invention, there is provided a method of manufacturing a semiconductor device including:

disposing a mask on a semiconductor substrate having electrodes formed in a partial surface area, the mask having openings corresponding to the electrodes;

depositing conductive material on the electrodes exposed on bottoms of the openings of the mask;

disposing a growth substrate having conductive nanotubes bristled on a surface in such a manner that the conductive nanotubes face the semiconductor substrate, bringing the conductive nanotubes in areas where the openings of the mask are disposed into contact with the electrodes via the openings, and pushing the conductive nanotubes in areas where the openings are not disposed against the mask to bend the conductive nanotubes;

fixing the conductive nanotubes being in contact with the conductive material to the conductive material;

separating the growth substrate from the semiconductor substrate in such a manner that the conductive nanotubes fixed to the conductive material remain on the semiconductor substrate; and separating the mask from the semiconductor substrate.

According to another aspect of the present invention, there is provided a method of manufacturing a semiconductor device including:

forming a distal end metal material laminating an underlying film and a surface film in an order recited on distal ends of conductive nanotubes bristled on a surface of a growth substrate;

bringing the distal end metal materials into contact with electrodes formed on a partial surface area of a semiconductor substrate to fix the conductive nanotubes to the electrodes; and separating the growth substrate from the semiconductor substrate in such a manner that the conductive nanotubes fixed to the electrodes on the semiconductor substrate, wherein the underlying film is made of metal having a nature of enhancing tight adhesion between the conductive nanotubes and the surface films, and the surface film is made of metal softer than the metal of the underlying film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A semiconductor device manufacture method of the first embodiment will be described with reference to FIGS. 1A to 1E.

Figure 1A:
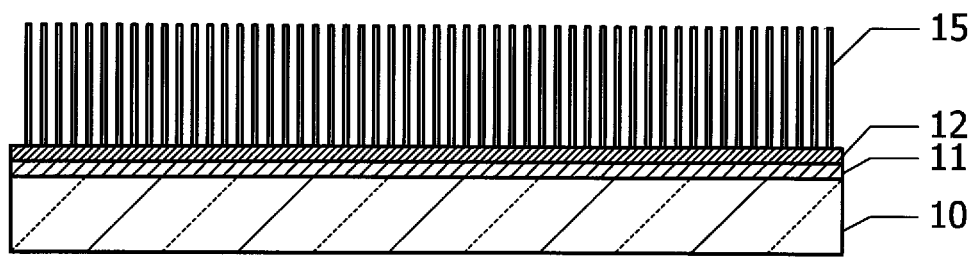
FIGS. 1A to 1E are cross sectional views of a semiconductor device in progress of a semiconductor device manufacture method according to a first embodiment.

FIG. 1A is a cross sectional view of a growth substrate 10 having a number of bristled carbon nanotubes 15. A carbon nanotube growth method will now be described.

On the surface of the growth substrate 10 made of quartz glass, silicon or the like, a Ti film 11 is formed, and a Ni film 12 is formed on the Ti film 11. A number of carbon nanotubes 15 are grown on the surface of the Ni film 12 by chemical vapor deposition using acetylene or the like as source gas. For example, a diameter of each carbon nanotube 15 is within a range of 5 nm to 10 nm, and a distribution density is within a range of $5\times10^{10}$ tubes/cm$^2$ to $1\times10^{11}$ tubes/cm$^2$. A distance between adjacent carbon nanotubes is within a range of 30 nm to 100 nm.

Figure 1B:
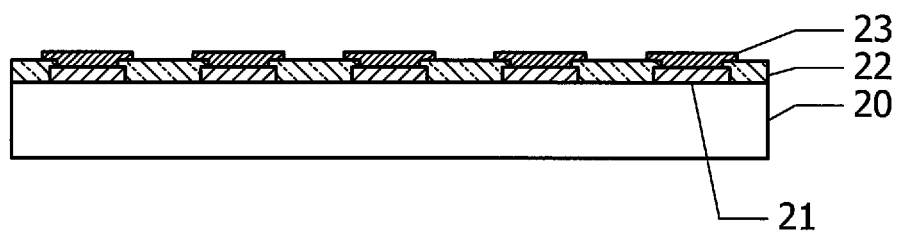

FIG. 1B is a cross sectional view of a semiconductor substrate to which carbon nanotubes are transferred. Pads 21 of Al or the like are formed on the uppermost surface of a semiconductor substrate 20 formed with semiconductor elements such as MOSFET and a multilayer wiring layer. A protective film 22 of insulating material is formed on the pads 21 and semiconductor substrate 20. Openings are formed in the protective film 22, and the pad 21 is exposed on the bottom of each opening. An electrode 23 of Al or the like is formed on the pad 21 exposed in the opening. The electrode 23 extends outward slightly from an outer circumferential line of the opening on the upper surface of the protective film 22.

Figure 1C:
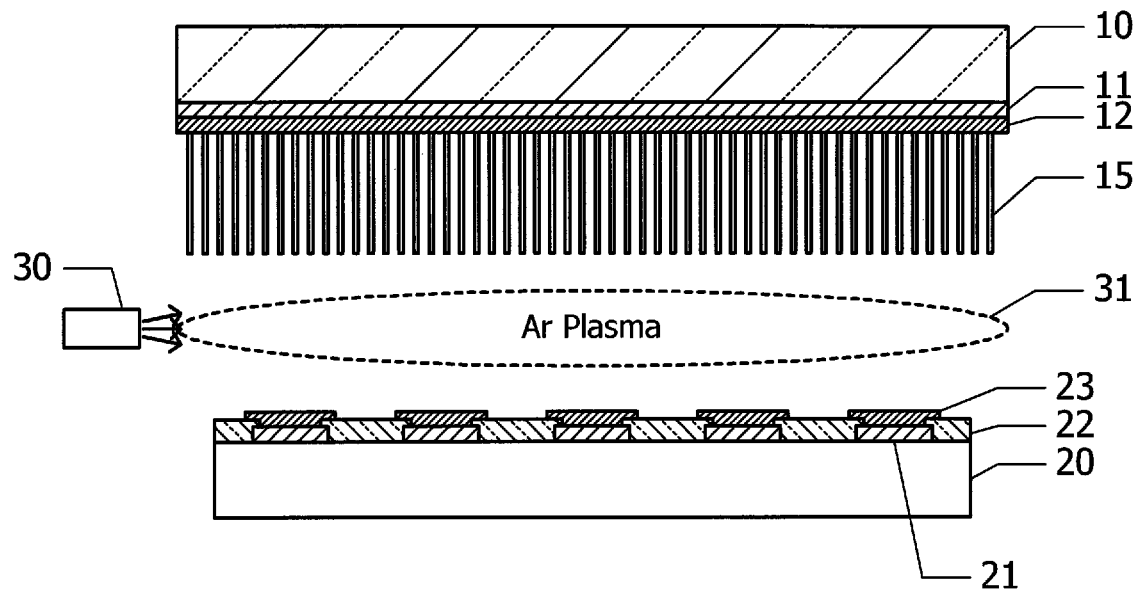

As illustrated in FIG. 1C, the semiconductor substrate 20 and the growth substrate 10 are loaded in a vacuum chamber, and the electrodes 23 face the carbon nanotubes 15 at a distance of, e.g., about 15 cm. An argon plasma generator 30 is disposed in the vacuum chamber. Argon plasma 31 is bombarded from the argon plasma generator 30 toward the distal ends of the carbon nanotubes 15 bristled on the surface of the growth substrate 10 and toward the surfaces of the electrodes 23 formed on the semiconductor substrate 20. The distal ends of the carbon nanotubes 15 are therefore activated. For example, although each of the carbon nanotubes 15 generally has cylindrical shape one end of which is closed, this end is opened by being bombarded with argon plasma. A natural oxide film on the surface of each electrode 23 is removed and a clean surface is exposed. Instead of argon plasma, plasma of rare gases other than argon may be used.

Figure 1D:
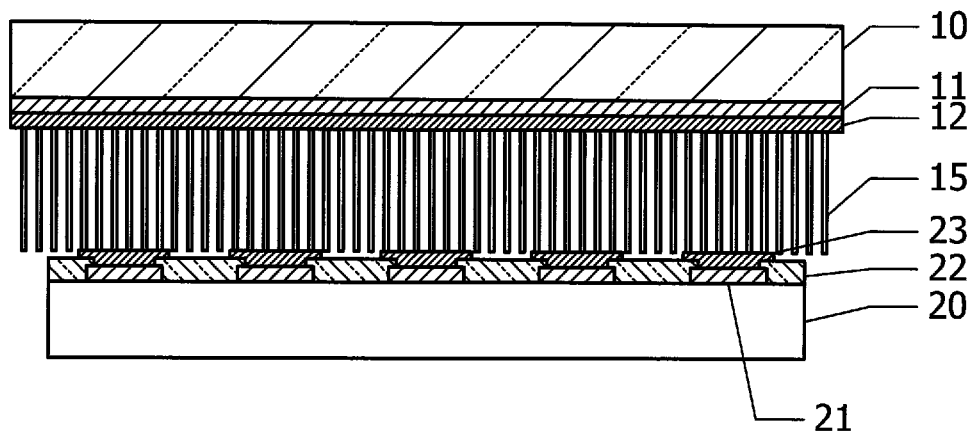

As illustrated in FIG. 1D, after bombarding with argon plasma, without exposing the semiconductor substrate 20 and the growth substrate 10 to the atmosphere, the growth substrate 10 is moved closer to the semiconductor substrate 20 to bring the distal ends of the carbon nanotubes 15 into contact with the surfaces of the electrodes 23. Since the distal ends of the carbon nanotubes 15 are activated and the surfaces of the electrodes 23 are cleaned by argon plasma, carbon constituting the carbon nanotubes 15 and aluminum constituting the electrodes 23 are alloyed in the contact portion between the carbon nanotubes and electrodes. In this manner, the carbon nanotubes 15 are fixed to the electrodes 23.

Figure 1E:
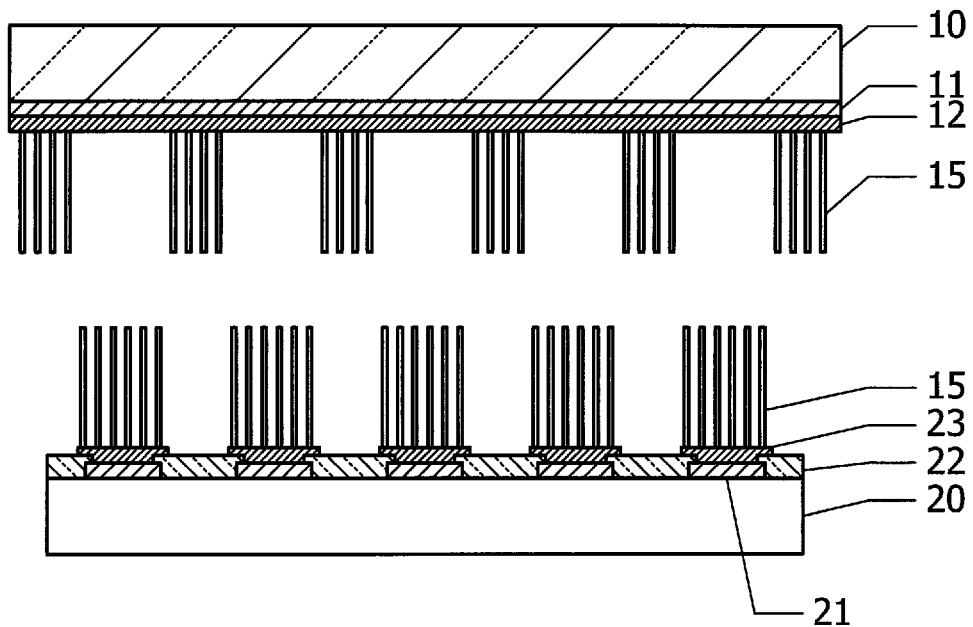

As illustrated in FIG. 1E, the semiconductor substrate 20 is separated from the growth substrate 10. The carbon nanotubes 15 not contacting the electrodes 23 are separated from the semiconductor substrate 20, remaining fixed to the growth substrate 10. The carbon nanotubes 15 fixed to the electrodes 23 are stripped from the growth substrate 15, and stay on the electrodes 23.

In the first embodiment, since paste-like conductive adhesive is not used, spread of the adhesive along the substrate in-plane will not occur while the carbon nanotubes 15 are brought into contact with the electrodes 23. Further, since solder is not used, spread of melted solder along the substrate in-plane will not occur. It is therefore possible to present the carbon nanotubes 15 from being bonded to the area other than the electrodes 23 of the semiconductor substrate 20.

In the first embodiment, although aluminum is used as the material of the electrodes 23, other metals alloying the carbon nanotubes 15 may also be used. These metals include titanium (Ti), molybdenum (Mo), tungsten (W), chrome (Cr), nickel (Ni), iron (Fe), cobalt (Co), magnesium (Mg) and the like. Alloy essentially consisting of these metals may also be used.

In the alloying process illustrated in FIG. 1D, it is preferable to apply a pressure sufficient for alloying the carbon nanotubes 15 and the electrodes 23. It is preferable to alloy the contact portions between the carbon nanotubes 15 and the electrodes 23 so that a contact strength between the carbon nanotubes 15 and the electrodes 23 is greater than that between the Ni film 12 on the growth substrate 10 and the carbon nanotubes 15.

Next, with reference to FIGS. 2A to 2F, a semiconductor manufacture method of the second embodiment will be described.

Figure 2A:
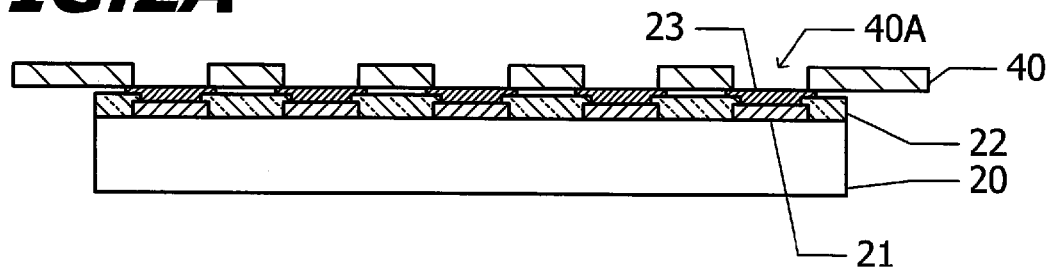
FIGS. 2A to 2F are cross sectional views of a semiconductor device in progress of a semiconductor device manufacture method according to a second embodiment.

A semiconductor substrate 20, pads 21, a protective film 22 and electrodes 23 illustrated in FIG. 2A are the same as those of the first embodiment illustrated in FIG. 1B. The semiconductor substrate 20 is loaded in a vacuum chamber, and a mask 40 is disposed on the semiconductor substrate 20. Openings 40A matching the electrodes 23 are formed through the mask 40. The electrodes 23 are exposed on the bottoms of the openings 40A. An area where the electrodes 23 are not formed is covered with the mask 40.

Figure 2B:
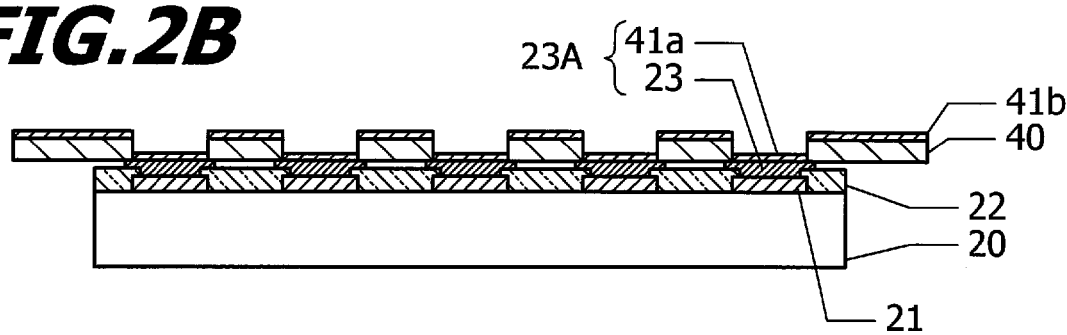

As illustrated in FIG. 2B, aluminum is deposited on the surfaces of the electrodes 23 and the mask 40 to form aluminum films 41a and 41b. The aluminum films 41a and 41b may be formed by sputtering. A thickness of the aluminum films 41a and 41b is, for example, 1 µm. The electrode 23 and the aluminum film 41a deposited on the surface of the electrode 23 constitute an electrode 23A.

Figure 2C:
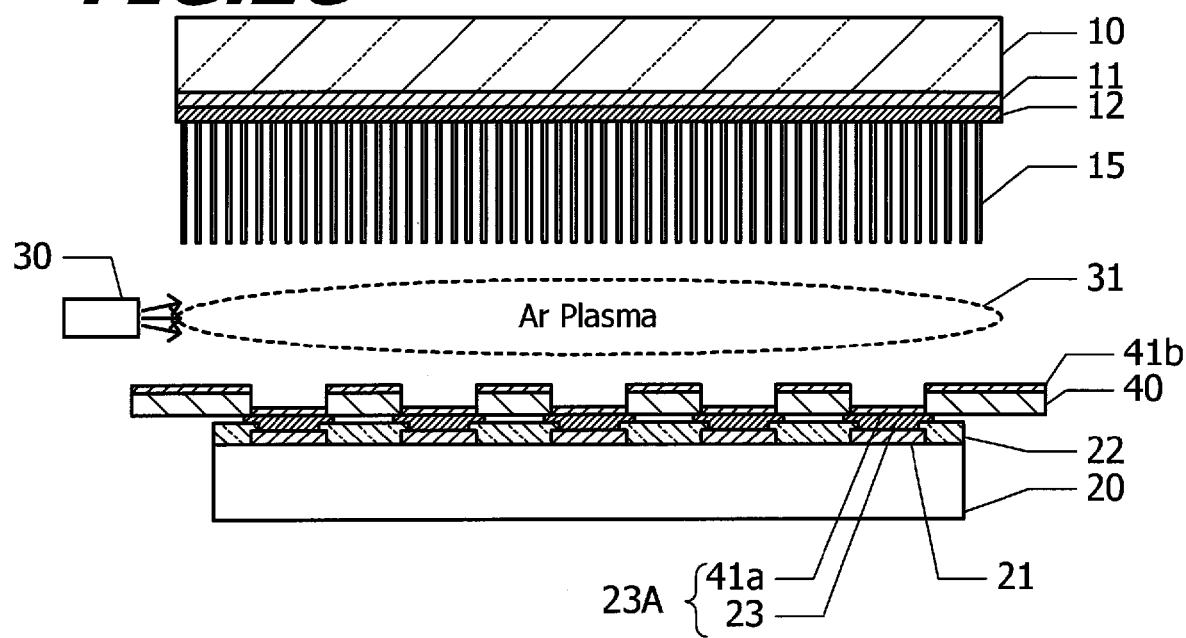

As illustrated in FIG. 2C, a growth substrate 10 having bristled carbon nanotubes 15 is disposed above the semiconductor substrate 20 in such a manner that the carbon nanotubes 15 and the semiconductor substrate 20 face each other. Argon plasma 31 is bombarded to the distal ends of the carbon nanotubes 15 and the surfaces of the electrodes 23A and the aluminum film 41b.

Figure 2D:
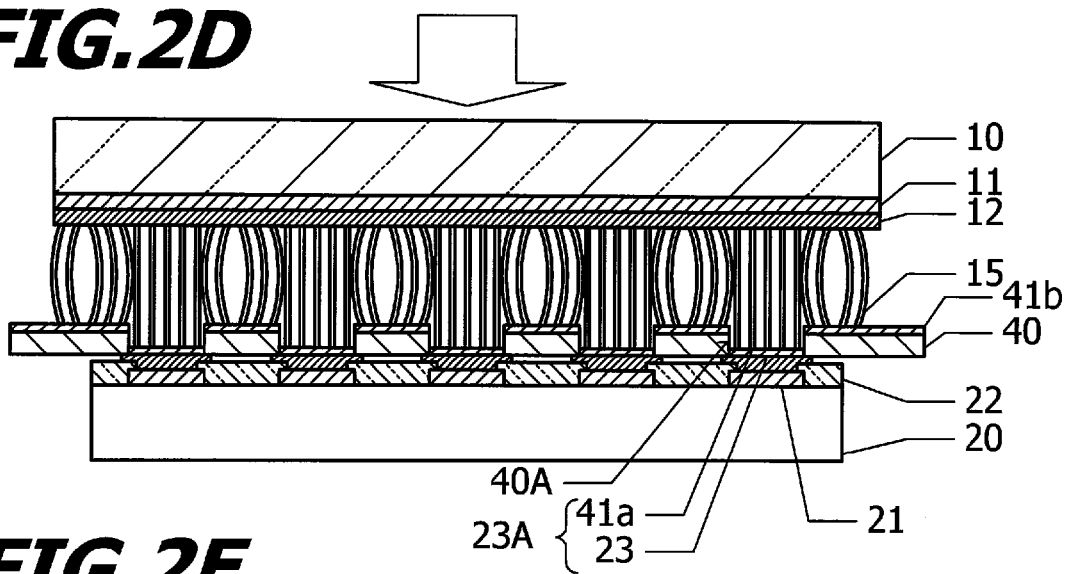

As illustrated in FIG. 2D, the growth substrates 10 is moved closer to the semiconductor substrate 20 to bring the distal ends of the carbon nanotubes 15 into contact with the aluminum film 41b. Then, the growth substrate 10 is pushed against the semiconductor substrate 20 to bring the distal ends of the carbon nanotubes 15 in a region corresponding to the openings 40A into contact with the surfaces of the electrodes 23A. The carbon nanotubes 15 contacting the aluminum film 41b on the mask 40 bend due to elastic deformation. For example, as a force of 3 N to 5 N is applied to an area of 1 mm$^2$, it is possible to bend by about 30%, carbon nanotubes bristled at a distribution density of $5\times10^{10}$ tubes/cm$^2$ to $1\times10^{11}$ tubes/cm$^2$. "Bend by x %" means a bend in such a manner that a straight line distance from the proximal end to the distal end of a bent carbon nanotube is shorter than a total length of the carbon nanotube itself by x % of the total length of the carbon nanotube.

Alloy of carbon and aluminum is formed in a contact portion between the carbon nanotubes 15 and the electrodes 23A and in a contact portion between the carbon nanotubes 15 and the aluminum film 41b. The carbon nanotubes 15 contacting the electrodes 23A are therefore fixed to the electrodes 23A. The carbon nanotubes 15 contacting the aluminum films 41b on the mask 40 are fixed to the mask 40.

Figure 2E:
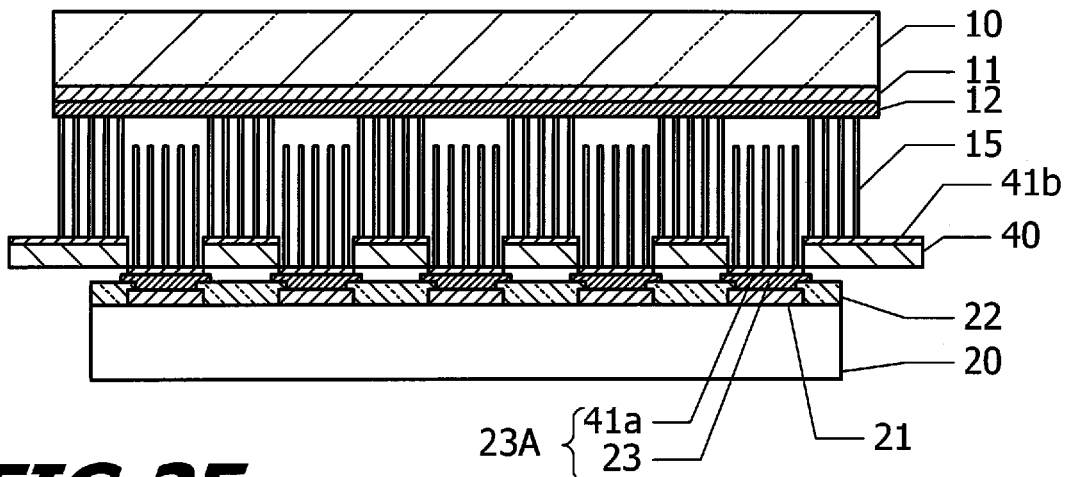

As illustrated in FIG. 2E, the force of pushing the growth substrate 10 against the semiconductor substrate 20 is released. The growth substrate 10 goes up from the semiconductor substrate 20 by a restoring force of the bent carbon nanotubes 15 makes. At this time, the carbon nanotubes 15 fixed to the electrodes 23A are uncoupled from the growth substrate 10 and left (transferred) on the semiconductor substrate 20.

Figure 2F:
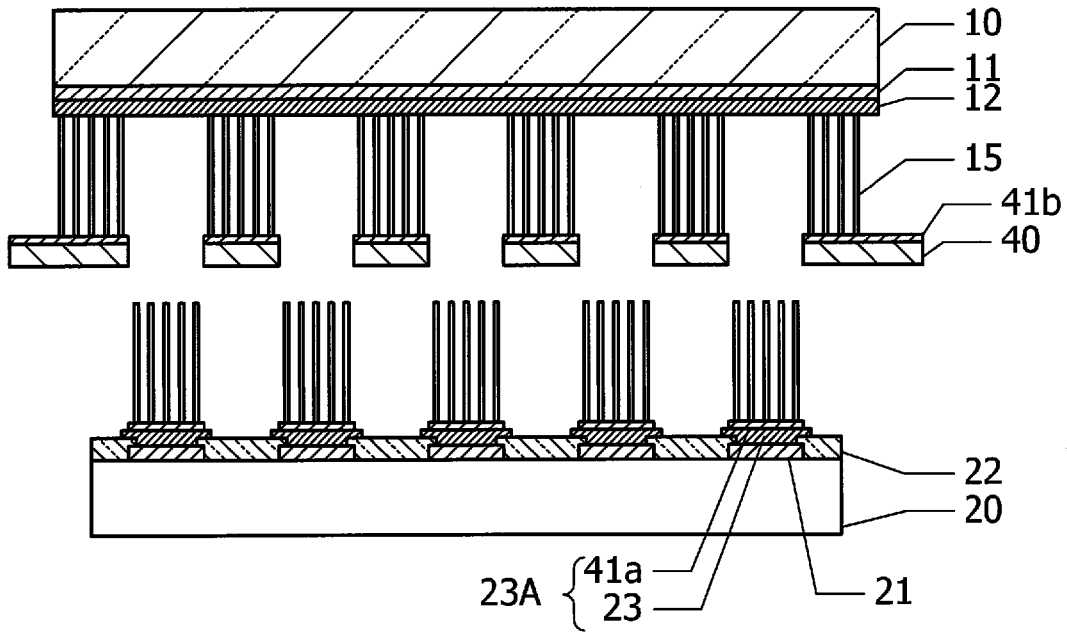

As illustrated in FIG. 2F, the growth substrate 10 is separated from the semiconductor substrate 20. Since the mask 40 is coupled to the growth substrate 10 via the carbon nanotubes 15, the mask 40 is separated from the semiconductor substrate 20 together with the growth substrate 10.

As in the case of the first embodiment, also in the second embodiment, it is possible to prevent the carbon nanotubes 15 from being bonded to an unnecessary area other than the electrodes 23A of the semiconductor substrate 20. In the second embodiment, it is possible to separate the growth substrate 10 from the semiconductor substrate 20 by releasing the force of pushing the growth substrate 10 against the semiconductor substrate 20 in the state illustrated in FIG. 2D. It is therefore unnecessary to apply an external force of stripping the carbon nanotubes 15 fixed to the electrodes 23A from the growth substrate 10.

In the state illustrated in FIG. 2D, if a bend amount of the carbon nanotubes 15 was too small, it would be difficult to separate the growth substrate 10 from the semiconductor substrate 20 by the restoring force. Conversely, if a bend amount of the carbon nanotubes 15 was too large, pushing force to be applied to the growth substrate 10 would be large. If a bend amount of the carbon nanotubes 15 exceeded a limit of elastic deformation, the restoring force could not be utilized. Considering these points, it is preferable to set length of the carbon nanotubes 15 and a thickness of the mask 40 so as to bend the carbon nanotubes 15 by 10% to 30%. Namely, it is preferable to set a thickness of the mask 40 within a range of 10% to 30% of a length of the carbon nanotubes 15.

Next, with reference to FIGS. 3A to 3F, a semiconductor manufacture method of the third embodiment will be described.

Figure 3A:
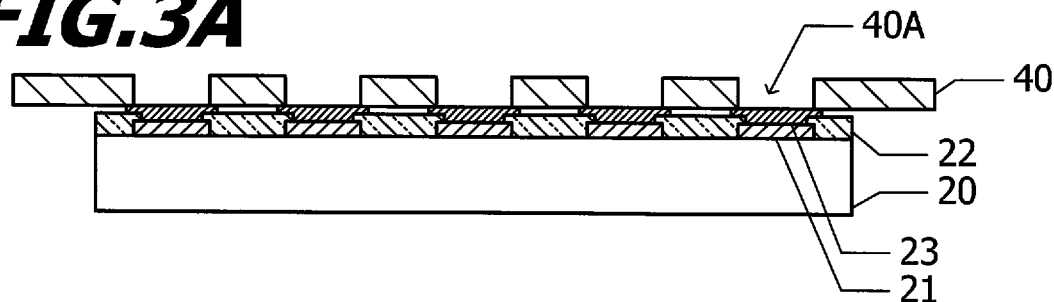
FIGS. 3A to 3F are cross sectional views of a semiconductor device in progress of a semiconductor device manufacture method according to a third embodiment.

A semiconductor substrate 20, pads 21, a protective film 22 and 15 electrodes 23 illustrated in FIG. 3A are the same as those of the first embodiment illustrated in FIG. 1B. A mask 40 is disposed on the semiconductor substrate 20. Openings 40A matching the electrodes 23 are formed through the mask 40. The electrodes 23 are exposed on the bottoms of the openings 40A. An area where the electrodes 23 are not formed is covered with the mask 40.

Figure 3B:
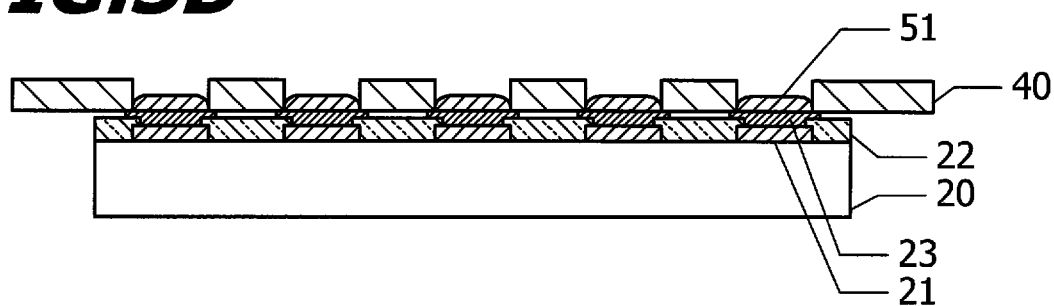

As illustrated in FIG. 3B, paste-like conductive material 51 is deposited on the electrodes 23 in the openings 40A. Conductive resin such as silver paste, solder paste or the like may be used as the conductive material 51. The conductive material 51 may be deposited by a screen print method using a squeegee.

Figure 3C:
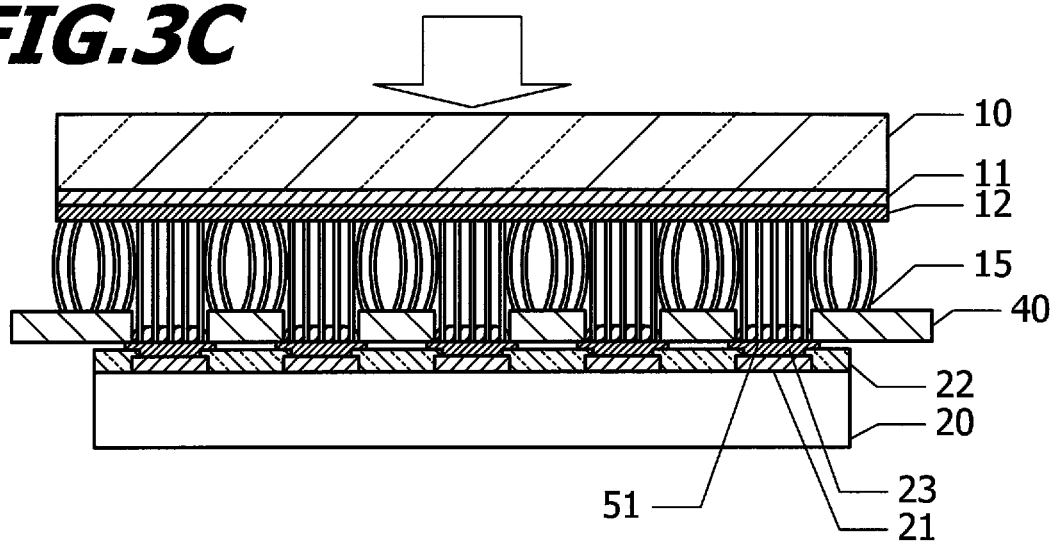

As illustrated in FIG. 3C, a growth substrate 10 having carbon nanotubes 15 bristled on the substrate surface is disposed to face the semiconductor substrate 20. After the distal ends of the carbon nanotubes 15 get in contact with the mask 40, the growth substrate 10 is pushed against the semiconductor substrate 20. The carbon nanotubes 15 being in contact with the mask 40 bend, and the distal ends of the carbon nanotubes 15 in the areas where the openings 40A are formed enter the paste-like conductive material 51. In order not to overflow the conductive material 51 from the openings 40A at the time when the carbon nanotubes 15 enter the paste-like conductive material 51, a deposition amount of the conductive material 51 is adjusted.

The semiconductor substrate 20 is heated in this state to cure the conductive material 51. A heating temperature depends upon binder resin of the conductive material 51. For example, if epoxy-based resin is used, a heating temperature is set to 150° C. to 200° C. If a polyimide-based resin is used, a heating temperature is set to 200° C. to 250° C. As the conductive material 51 is cured, the carbon nanotubes 15 are fixed to the electrodes 23. The material that is resistant to this heating temperature is used as the mask 40.

Figure 3D:
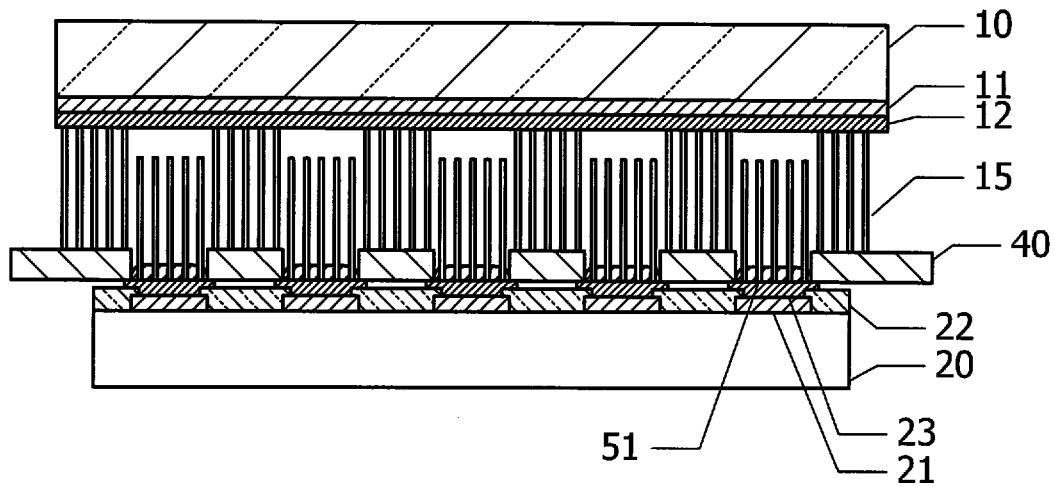

As illustrated in FIG. 3D, the force pushing the growth substrate 10 against the semiconductor substrate 20 is released. The growth substrate 10 goes up from the semiconductor substrate 20 by restoring force of the bent carbon nanotubes 15. At this time, the carbon nanotubes 15 fixed to the electrodes 23 are stripped from the growth substrate 10 and left (transferred) on the semiconductor substrate 20.

Figure 3E:
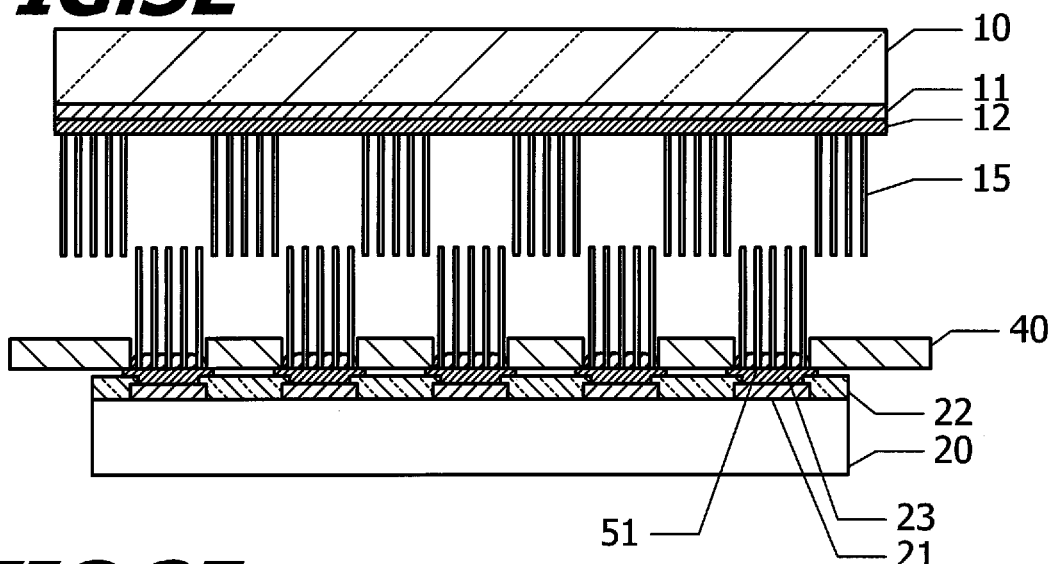
Figure 3F:
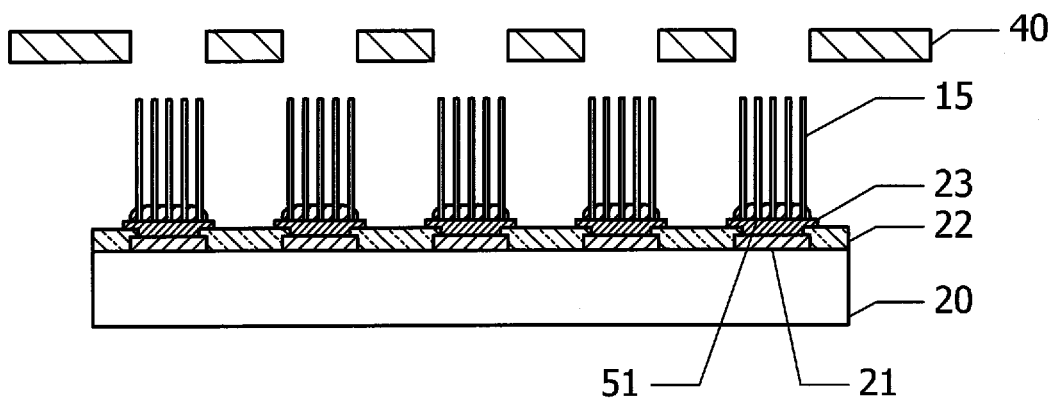

As illustrated in FIG. 3E, the growth substrate 10 is separated from the semiconductor substrate 20. Since the carbon nanotubes 15 fixed to the electrodes 23 have already been stripped from the growth substrate 10, the growth substrate 10 is easily able to be separated from the semiconductor substrate 20. As illustrated in FIG. 3F, the mask 40 is removed from the semiconductor substrate 20.

In the third embodiment, as illustrated in FIG. 3C, the paste-like conductive material 51 is contained in the openings 40A formed through the mask 40. It is therefore possible to prevent the conductive material 51 extends to the area on the substrate surface where the electrodes 23 are not formed.

If substance capable of forming compound with carbon is used as the material of the mask 40, in the process illustrated in FIG. 3C there is fear that the carbon nanotubes 15 are fixed to the mask 40. By using the substance unable to form compound with carbon as the material of the mask 40, the growth substrate 10 is easily able to be separated from the mask 40 in the process illustrated in FIG. 3E. As in the case of the second embodiment, a thickness of the mask 40 is preferably set within a rang of 10% to 30% of a length of a carbon nanotube 15.

Figure 4A:
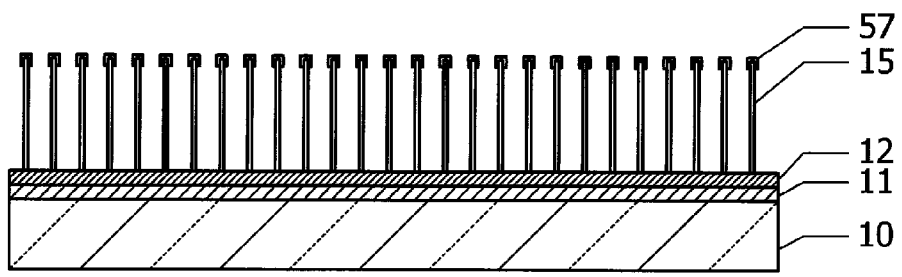
FIG. 4A is a cross sectional view of a semiconductor device in progress of a semiconductor device manufacture method according to a fourth embodiment.
Figure 4B:
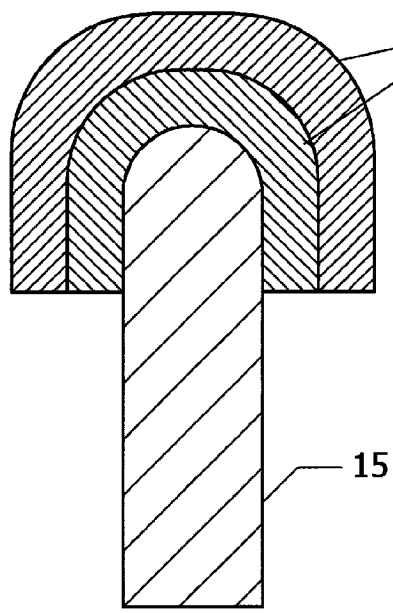
FIGS. 4B and 4C are cross sectional views illustrating the distal ends of carbon nanotubes.
Figure 4C:
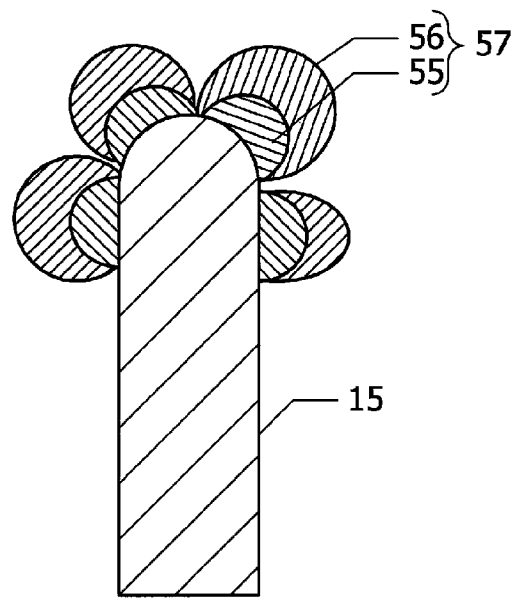
Figure 4D:
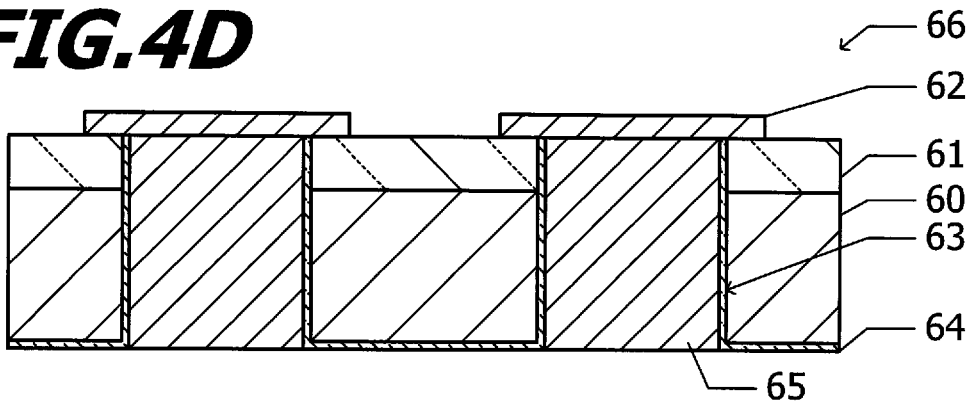
FIGS. 4D to 4H are cross sectional views of the semiconductor device in progress of the semiconductor device manufacture method of the fourth embodiment.
Figure 4E:
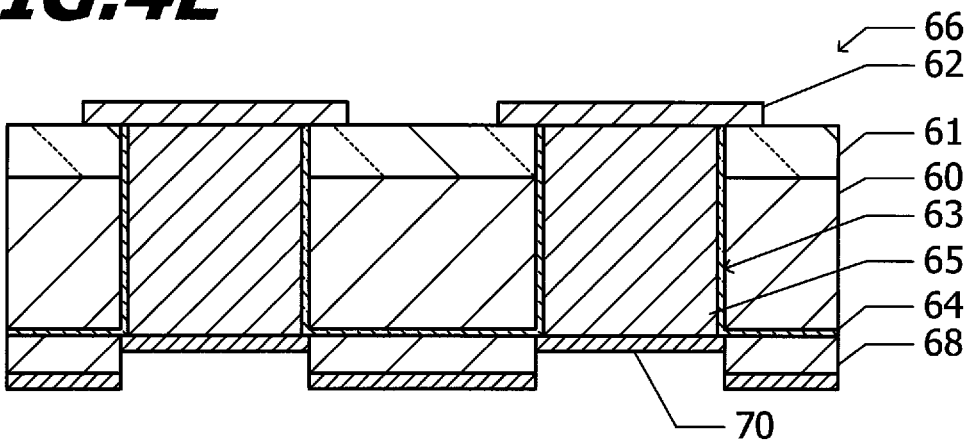
Figure 4F:
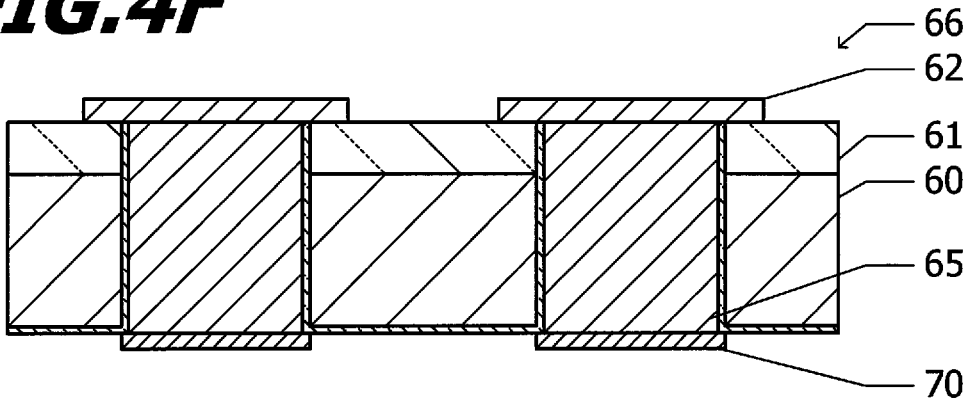
Figure 4G:
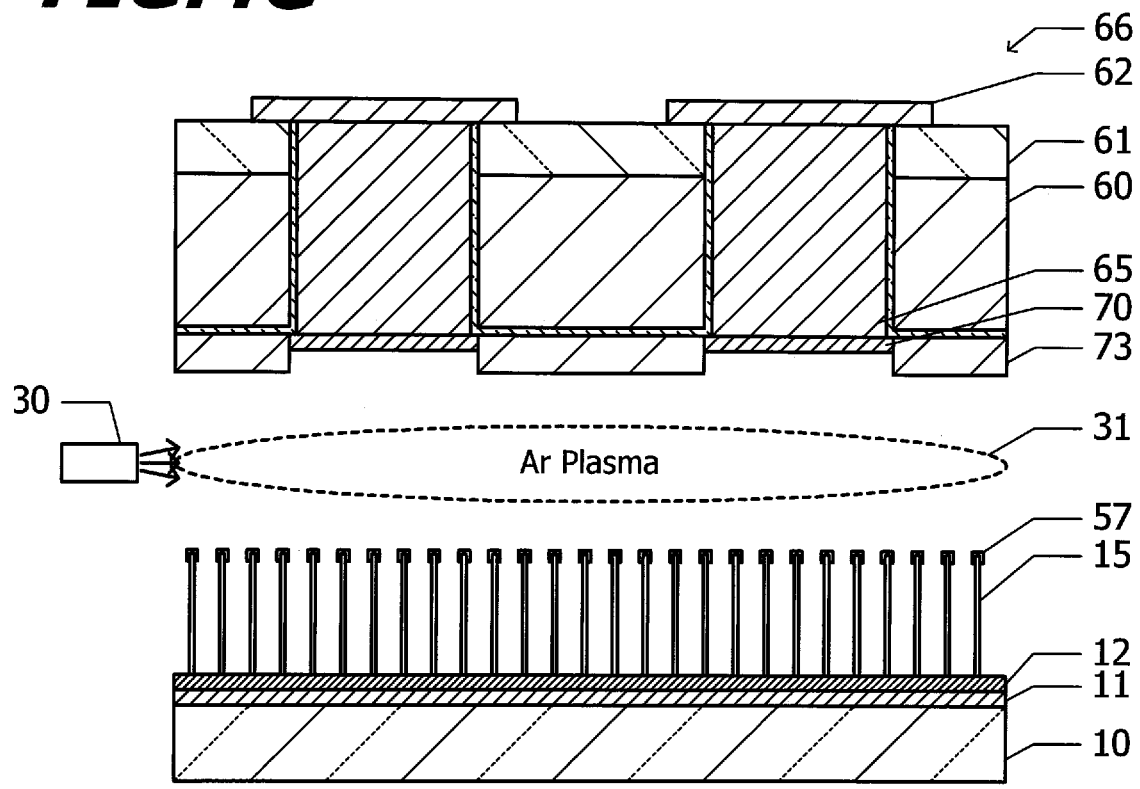
Figure 4H:
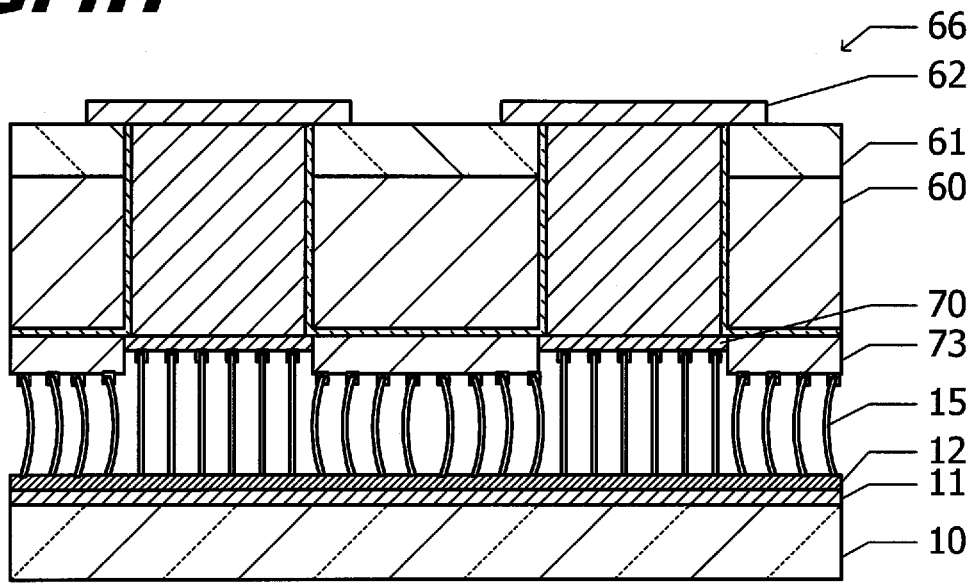
Figure 4L:
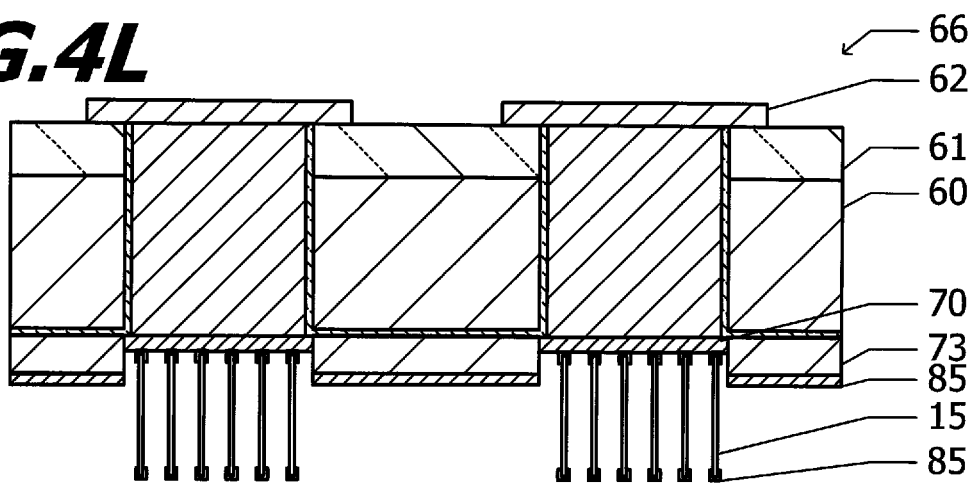
FIGS. 4L and 4P are cross sectional views of the semiconductor device in progress of the semiconductor device manufacture method of the fourth embodiment.
Figure 4M:
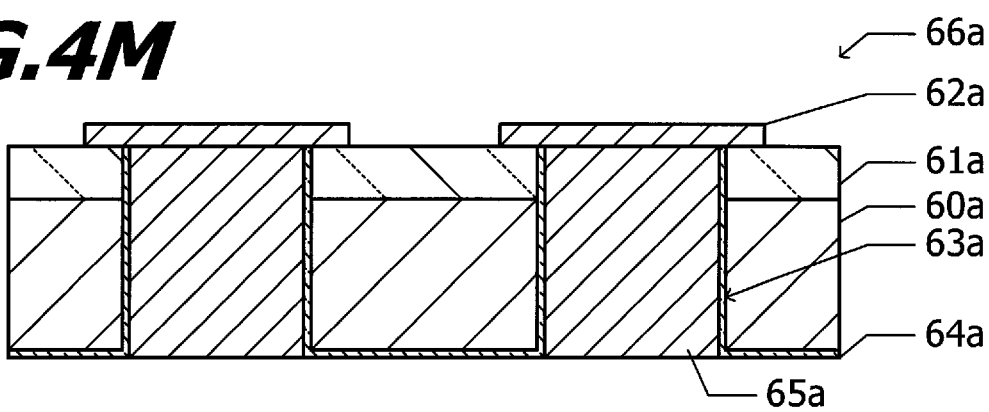
FIGS. 4I and 4J are cross sectional views illustrating the distal ends of carbon nanotubes in progress of the semiconductor device manufacture method of the fourth embodiment.
FIG. 4K is a cross sectional view of the semiconductor device.
FIG. 4Q is a cross sectional view of the semiconductor device in progress of the semiconductor device manufacture method of the fourth embodiment.
Figure 4P:
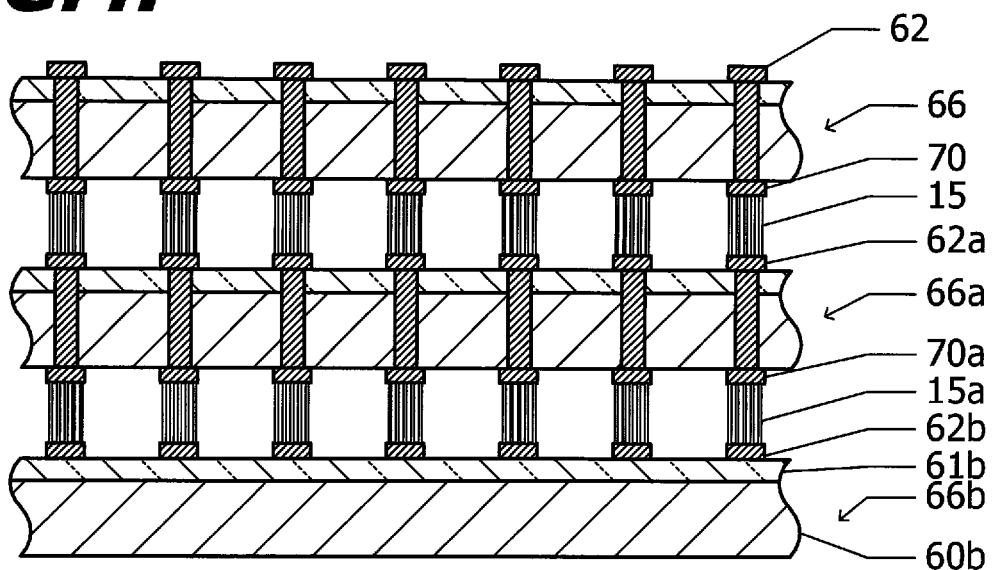
Figure 4Q:
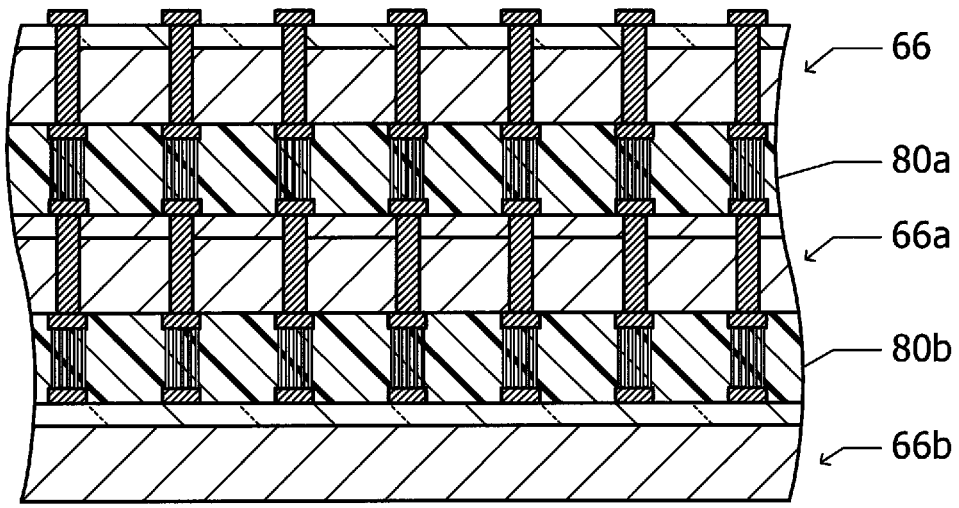

With reference to FIGS. 4A to 4Q, a semiconductor manufacture method of the fourth embodiment will be described.

A growth substrate 10, a Ti film 11, a Ni film 12 and carbon nanotubes 15 illustrated in FIG. 4A are the same as those of the first embodiment illustrated in FIG. 1A. An underlying metal and a surface layer metal are sequentially attached to the distal ends of the carbon nanotubes 15.

FIG. 4B is an enlarged cross sectional view illustrating the distal end of the carbon nanotube 15. A distal end metal material 57 is attached to the distal end of the carbon nanotube 15. The distal end metal material 57 is constituted of two layers including an underlying film 55 covering the surface of the distal end of the carbon nanotube 15 and a surface film 56 covering the surface of the underlying film 55. As illustrated in FIG. 4C, the underlying film 55 may be discretely distributed without continuously covering the surface of the distal end of the carbon nanotube 15. In this case, the surface film 56 is attached to each surface of the discretely distributed underlying films 55.

Metal that forms alloy with carbon such as Ti, W and Cr is used as the material of the underlying film 55. Metal that is softer than metal of the underlying film 55, such as Al and Au, is used as the material of the surface film 56. For example, a diameter of the carbon nanotube 15 is within a range of 5 nm to 10 nm, and a thickness of each of the underlying film 55 and the surface film 56 is about a half of the diameter of the carbon nanotube 15.

Since a distance of adjacent carbon nanotubes 15 is about within a range of 30 nm to 100 nm, the distal end metal materials 57 attached to the distal ends of the adjacent carbon nanotubes 15 will not couple with each other and will not form a single continuous film.

While the underlying film 55 and the surface film 56 are formed, the growth substrate 10 may be inclined relative to a target of sputtering. As the growth substrate 10 is inclined, metal atoms to be attached become suppressed to reach the proximal end or base of the carbon nanotube 15. Metal is therefore able to be efficiently attached to the distal end of the carbon nanotube 15. During sputtering, the growth substrate 10 may be rotated about an axis perpendicular to its surface. By rotating the growth substrate 10, it is possible to prevent the distal end metal materials 57 from being biased toward one side.

FIG. 4D is a cross sectional view of a first substrate 66 having electrodes to which carbon nanotubes are to be bonded. Electronic circuit components such as MOSFET are formed on the surface of a semiconductor substrate 60. A multilayer wiring layer 61 is formed on the surface with the electronic circuit components. Electrodes 62 are formed on the multilayer wiring layer 61. Through via holes 63 are formed passing from a bottom surface of the semiconductor substrate 60 through the semiconductor substrate 60 and multilayer wiring layer 61 and reaching the bottoms of the surface side electrodes (front electrodes) 62.

An insulating film 64 is formed on the side walls of the through via holes 63 and the bottom surface of the semiconductor substrate 60. Each of the through via holes 63 is filled with a vertical connector material 65. The vertical connector material 65 is connected to the front electrode 62. A method of forming a substrate including the vertical connector material extending from the bottom surface of the semiconductor substrate 60 and reaching the front electrode 62 is disclosed, for example, in International Publication WO2004/064159.

As illustrated in FIG. 4E, a first metal mask 68 is disposed on the bottom surface of the first substrate 66. Openings corresponding to the vertical connector materials 65 are formed through the first metal mask 68. A metal film 70 of aluminum or the like is formed on the surface of the vertical connector material 65 exposed in each opening of the first metal mask 68, by sputtering, vapor deposition or the like. A thickness of the metal film 70 is, for example, within a range of 1 μm to 2 μm. A metal film 70 is also attached to the surface of the first metal mask 68.

As illustrated in FIG. 4F, the first metal mask 68 is removed from the first substrate 66. The metal film 70 is left on the vertical connector material 65.

As illustrated in FIG. 4G, a second metal mask 73 is disposed on the bottom surface of the first substrate 66. Similar to the first metal mask 68 illustrated in FIG. 4E, openings corresponding to the vertical connector materials 65 are formed through the second metal mask 73. The first substrate 66 and the growth substrate 10 are disposed at a distance therebetween in such a manner that the surface of the growth substrate 10 illustrated FIG. 4A on which the carbon nanotubes 15 bristle faces the bottom surface of the first substrate 66. Ar plasma 31 is bombarded to surfaces facing each other. Metal oxide and contamination on the surfaces of the metal films 70 and the distal end metal materials 57 are removed, and the metal surface is activated.

As illustrated in FIG. 4H, the growth substrate 10 is moved closer to the first substrate 66 to bring the distal end metal materials 57 at the distal ends of the carbon nanotubes 15 into contact with the metal mask 73. A pressure is applied until the carbon nanotubes 15 are bent to bring the distal end metal materials 57 into contact with the metal films 70. In this state, the first substrate 66 is heated to about 300° C. The surface films 56 of the distal end metal materials 57 are therefore bonded to the metal film 70.

As the distal end metal materials 57 attached to the distal ends of the adjacent carbon nanotubes 15 are linked with other and form a film, the carbon nanotubes 15 become difficult to enter the openings of the second metal mask 73. In order to bring the distal metal members 57 into contact with the metal films 70, it is preferable that the distal end metal material 57 is made thin to the extent that the distal end metal materials 57 attached to adjacent carbon nanotubes 15 will not be linked with each other.

As illustrated in FIG. 4I, the surface film 56 at the distal end of the carbon nanotube 15 deforms to follow the shape of the surface of the metal film 70 by pressure and heat so that the contact area between the surface film 56 and the metal film 70 increases. As illustrated in FIG. 4J, even if the distal end metal materials 57 are attached dispersively, the surface film 56 contacting the metal film 70 deforms so that the contact area between the metal film 70 and surface film 56 increases.

Although the carbon tube 15 is likely to deform such as bend in a macro viewpoint, it is hard to deform in a micro viewpoint. In the case where the carbon nanotube 15 is in direct contact with the metal film 70, this contact therebetween is almost a point contact. In the fourth embodiment, a contact area between the surface film 56 and the metal film 70 increases so that the carbon nanotube 15 is firmly fixed to the metal film 70.

As illustrated in FIG. 4K, the growth substrate 10 is separated from the first substrate 66. The carbon tubes 15 whose distal end metal materials 57 had been in contact with the metal film 70 detach from the growth substrate 10, and are fixed (transferred) on the metal film 70. The distal ends (ends which had attached to the growth substrate 10) of the transferred carbon nanotubes 15 are in a carbon-exposed state, and the carbon nanotubes 15 whose distal end metal materials 57 had been in contact with the metal mask 73 remain left on the growth substrate 10.

As illustrated in FIG. 4L, distal end metal materials 85 are attached to the distal ends of the carbon nanotubes 15 transferred to the first substrate 66. Similar to the distal end metal materials 57 illustrated in FIG. 4I or 4J, the distal end metal materials 85 have the two-layer structure of an underlying film and a surface film. The materials of the underlying film and the surface film are the same as those of the distal end metal materials 57.

As illustrated in FIG. 4M, a second substrate 66a to be connected to the first substrate 66 is prepared. Similar to the first substrate 66 illustrated in FIG. 4D, the second substrate 66a includes a semiconductor substrate 60a, a multilayer wiring layer 61a, electrodes 62a, through via holes 63a, an insulating film 64a, and vertical connector materials 65a. The electrodes 62a are made of, for example, aluminum.

As illustrated in FIG. 4N, the first substrate 66 and the second substrate 66a are disposed being separated at a distance therebetween, with the bottom surface of the first substrate 66 facing the top surface of the second substrate 66a. Ar plasma 31 is bombarded to surfaces facing each other of the first substrate 66 and the second substrate 66a. The surfaces of the distal end metal materials 85 and the electrodes 62a are therefore activated.

As illustrated in FIG. 4O, the first substrate 66 is moved closer to the second substrate 66a to bring the distal end metal materials 85 of the carbon nanotubes 15 into contact with the electrodes 62a. By applying pressure and heat, the distal end metal materials 85 are bonded to the electrode 62a. A distance between the first substrate 66 and the second substrate 66a is, for example, about within a range of 10 μm to 50 μm.

As illustrated in FIG. 4P, a third substrate 66b is coupled to the bottom surface of the second substrate 66a in the following manner. Electrodes 62b are formed on the top surface of the third substrate 66b, and metal films 70a are formed on the bottom surface of the second substrate 66a. The electrodes 62b and the metal films 70a are mechanically and electrically connected by carbon nanotubes 15a. The third substrate 66b is coupled in the same way as adopted to couple the second substrate 66a to the first substrate 66.

As illustrated in FIG. 4Q, a space between the first substrate 66 and the second substrate 66a and a space between the second substrate 66a and the third substrate 66b are filled with resin 80a and resin 80b, respectively. Epoxy, cyanate ester, benzocyclobutene or the like is used as the filled resin 80a and the resin 80b. Filling the spaces with resin is performed, for example, by immersing a three-dimensionally fabricated substrate in resin solution at a low pressure, and thereafter turning the pressure back to a normal pressure.

In the first substrate 66 and the second substrate 66a of the fourth embodiment, the vertical connector materials 65 and 65a extend from the bottom surfaces of the semiconductor substrates 60 and 60a, pass through the multi-layer wiring layers 61 and 61a, and reach the front electrodes 62 and 62a, respectively. A substrate may also be used having a different structure as the structure of electrically connecting the front electrodes and bottom electrodes of a substrate.

Figure 5:
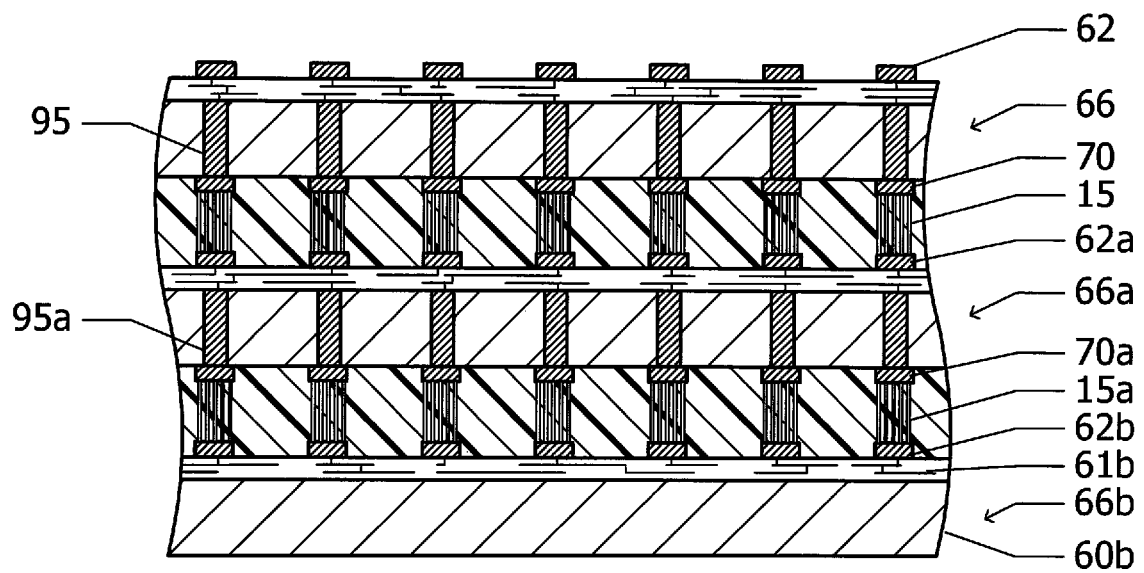
FIG. 5 is a cross sectional view of a semiconductor device manufactured by a modified method of the fourth embodiment.

FIG. 5 illustrates a three-dimensionally fabricated substrate whose front and bottom electrodes are electrically connected by a different structure. Vertical connector materials 95 and 95a pass through semiconductor substrates 60 and 60a, but do not pass through multilayer wiring layers 61 and 61a, respectively. The vertical connector materials 95 and 95a are connected to front electrodes 62 and 62a via wirings, plugs or the like in the multilayer wiring layers 61 and 61a, respectively. Metal films 70 and 70a are formed on the bottom surfaces of the vertical connector materials 95 and 95a, respectively. These vertical connector materials 95 and 95a may be formed by filling a recess having an opening on a front surface and a closed bottom with a conductive material and thereafter performing chemical mechanical polishing from the bottom surface until the conductive material is exposed (For example, International Publication WO2005/119776, JP-A-11-261001 and the like).

In the fourth embodiment, as illustrated in FIGS. 4I and 4J, as the distal end metal materials 57 deform, a mechanical bonding strength between the carbon nanotubes 15 and the metal layers 70 is increased, and an electric contact resistance lowers.

Next, description will be made on preferable material of the underlying film 55 and the surface film 56 of the distal end metal material 57. It is preferable to use metal capable of enhancing tight adhesion between the surface film 56 and the carbon nanotubes 15 as the underlying film 55. Such metal includes metal that forms alloy with carbon, e.g., Ti, W, Cr and the like. It is preferable to use metal softer than the metal used for the underlying film 55 as the surface film 56. It is more preferable to use metal whose softness is equal to or softer than Cu. Such metal includes Al, Au or the like. Au is more preferable in terms of oxidation resistance.

In the fourth embodiment, as illustrated in FIG. 4G, after the metal films 70 are formed and the distal end metal materials 57 are attached, the surfaces of both the films and metal members are activated with Ar plasma. As an alternative, if vacuum atmosphere is maintained after the metal films 70 are formed and the distal end metal materials 57 are attached and before the metal films 70 and the distal end metal materials 57 are bonded with each other, then the Ar plasma process is unnecessary.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:

bombarding electrodes formed in a partial surface area of a semiconductor substrate and distal ends of conductive nanotubes bristled on a surface of a growth substrate with rare gas plasma to activate at least the distal ends of the conductive nanotubes;

bringing the distal ends of the conductive nanotubes bombarded with the rare gas plasma and activated thereby into contact with the electrodes bombarded with the rare gas plasma to fix the conductive nanotubes to the electrodes; and separating the growth substrate from the semiconductor substrate in such a manner that the conductive nanotubes fixed to the electrodes remain on the electrodes formed on the semiconductor substrate, wherein the conductive nanotubes are fixed to the electrodes by alloying material of the conductive nanotubes of which the distal ends are activated and material of the electrodes, in contact portions between the conductive nanotubes and the electrodes.

2. The method according to claim 1, wherein:

a mask having openings corresponding to the electrodes is disposed on a surface where the electrodes are formed, before the electrodes are bombarded with the rare gas plasma;

in the bombarding the electrodes and the distal ends of the conductive nanotubes, a surface of the mask and surfaces of the electrodes exposed in the openings of the mask are bombarded with the rare gas plasma;

in fixing the conductive nanotubes to the electrodes, the conductive nanotubes in areas where the openings of the mask are disposed are brought into contact with the electrodes via the openings, and the conductive nanotubes in areas where the openings are not disposed are pushed against the mask to bent; and the separating the growth substrate from the semiconductor substrate includes separating the mask from the semiconductor substrate.

3. The method according to claim 2, wherein a thickness of the mask is within a range of 10% to 30% of a length of the conductive nanotubes.

4. The method according to claim 1, further comprising:

before the distal ends of the conductive nanotubes are bombarded with the rare gas plasma, forming a distal end metal material laminating an underlying film and a surface film in an order recited on each of the distal ends of the conductive nanotubes, wherein:

the underlying film is made of metal having a nature of enhancing tight adhesion between the conductive nanotubes and the surface films, and the surface film is made of metal softer than the metal of the underlying film; and in the bombarding the electrodes and the distal ends of the conductive nanotubes, the distal end metal materials are bombarded with the rare gas plasma.

5. The method according to claim 4, wherein the underlying film and the surface film are formed by sputtering under a condition that the growth substrate is inclined relative to a target to be sputtered.

6. The method according to claim 4, wherein the underlying film and the surface film are formed by sputtering while the growth substrate is rotated.

* * * * *